United States Patent
Ikeda et al.

(10) Patent No.: US 9,609,790 B2
(45) Date of Patent: Mar. 28, 2017

(54) HYBRID VEHICLE

(71) Applicant: Nissan Motor Co., Ltd., Kanagawa (JP)

(72) Inventors: Naoyasu Ikeda, Kanagawa (JP);
Yoshinori Sugita, Kanagawa (JP);
Yutaka Kobayashi, Kanagawa (JP);
Mikio Nozaki, Kanagawa (JP);
Shigeyuki Kiyota, Kanagawa (JP)

(73) Assignee: NISSAN MOTOR CO., LTD., Kanagawa (JP)

( * ) Notice: Subject to any disclaimer, the term of this patent is extended or adjusted under 35 U.S.C. 154(b) by 0 days.

(21) Appl. No.: 15/025,519

(22) PCT Filed: Sep. 27, 2013

(86) PCT No.: PCT/JP2013/076263
§ 371 (c)(1),
(2) Date: Mar. 28, 2016

(87) PCT Pub. No.: WO2015/045095
PCT Pub. Date: Apr. 2, 2015

(65) Prior Publication Data
US 2016/0212885 A1 Jul. 21, 2016

(51) Int. Cl.
*F16H 37/06* (2006.01)
*H05K 7/20* (2006.01)
(Continued)

(52) U.S. Cl.
CPC ........... *H05K 7/20927* (2013.01); *B60K 6/22* (2013.01); *B60K 6/28* (2013.01); *B60K 6/48* (2013.01);
(Continued)

(58) Field of Classification Search
CPC ........... B60W 10/06; B60W 2510/246; B60W 2510/107
(Continued)

(56) References Cited

U.S. PATENT DOCUMENTS 8,996,265 B2 * 3/2015 Kobayashi ............... B60K 6/48 477/110
9,205,832 B2 * 12/2015 Tsutsumi .............. B60W 20/40
(Continued)

FOREIGN PATENT DOCUMENTS

JP H09-286245 A 11/1997
JP 2006-153091 A 6/2006
(Continued)

OTHER PUBLICATIONS

International Preliminary Report on Patentability issued in corresponding International Application No. PCT/JP2013/076263, mailed on Jun. 13, 2014 (12 pages).

*Primary Examiner* — Ha D Ho
(74) *Attorney, Agent, or Firm* — Osha Liang LLP

(57) ABSTRACT

A hybrid vehicle has an internal combustion engine and a motor as a driving source, a transmission that changes a speed of rotation of the internal combustion engine or motor and transmits the rotation to driving wheels of the vehicle, a high-voltage battery that supplies power to the motor through an inverter, a cooling mechanism equipped with a pump to circulate a coolant and thereby cool the inverter, a coolant temperature measurement device that detects or estimates a temperature of the coolant, a low-voltage battery that supplies power to the pump, and a converter through which power is supplied from the high-voltage battery to the pump.

11 Claims, 11 Drawing Sheets

(51) Int. Cl.
*B60K 6/48* (2007.10)
*B60K 6/543* (2007.10)
*B60W 10/30* (2006.01)
*B60W 20/00* (2016.01)
*B60W 10/06* (2006.01)
*B60K 6/22* (2007.10)
*B60K 6/28* (2007.10)
*B60K 6/54* (2007.10)
*B60W 10/10* (2012.01)
*B60K 1/00* (2006.01)

(52) U.S. Cl.
CPC .............. *B60K 6/54* (2013.01); *B60K 6/543* (2013.01); *B60W 10/06* (2013.01); *B60W 10/10* (2013.01); *B60W 10/30* (2013.01); *B60W 20/00* (2013.01); *B60K 2001/005* (2013.01); *B60W 2510/0676* (2013.01); *B60W 2510/087* (2013.01); *B60W 2510/107* (2013.01); *B60W 2510/242* (2013.01); *B60Y 2200/92* (2013.01); *B60Y 2306/05* (2013.01); *B60Y 2400/112* (2013.01); *B60Y 2400/302* (2013.01); *B60Y 2400/61* (2013.01); *Y02T 10/6221* (2013.01); *Y10S 903/904* (2013.01); *Y10S 903/907* (2013.01); *Y10S 903/917* (2013.01)

(58) Field of Classification Search
USPC .......................................................... 74/661
See application file for complete search history.

(56) References Cited

U.S. PATENT DOCUMENTS 9,222,398 B2 * 12/2015 Mehring ................... F01P 3/02
9,243,600 B2 * 1/2016 Doering ............. F02N 11/0822
9,393,957 B2 * 7/2016 Hoshiba ................... B60K 6/24

FOREIGN PATENT DOCUMENTS

JP    2013-154707 A    8/2013
JP    2013-162558 A    8/2013

* cited by examiner

HYBRID VEHICLE

BACKGROUND

Field of the Invention

The present invention relates to a hybrid vehicle having an internal combustion engine and a motor as a vehicle driving source.

Related Art

Patent Document 1 discloses a hybrid vehicle that includes an engine, a generator capable of generating electric power by output power of the engine, a battery connected to a driving electric motor via an inverter and a cooling device having a circulation passage equipped with a radiator and an electric pump so as to circulate a coolant through the circulation passage and thereby cool the inverter by the coolant.

In the hybrid vehicle of Patent Document 1, it is conceivable that the temperature of the coolant in the circulation passage of the cooling device is raised by external heat during stop of the electric pump. In such a case, the temperature of the coolant passing through the inverter may temporarily become high when the electric motor gets actuated upon switching the vehicle control mode to a running mode. This leads to a possibility that, when the amount of heat generated by the inverter becomes large, the inverter cannot be sufficiently cooled by the coolant.

Patent Document 1: Japanese Laid-Open Patent Publication No. 2013-154707

SUMMARY

A hybrid vehicle according to one or more embodiments of the present invention comprises an internal combustion engine and a motor as a driving source; a transmission that changes a speed of rotation of the internal combustion engine or motor and transmits the rotation to driving wheels of the vehicle; a high-voltage battery that supplies power to the motor through an inverter; and a cooling mechanism equipped with a pump so as to circulate a coolant and cool the inverter by the coolant, wherein, in a high-coolant-temperature start-up condition that the temperature of the coolant is higher than or equal to a predetermined temperature value at power-on of the vehicle by driver's key operation, the pump is started before the supply of power from the high-voltage battery to the inverter.

One or more embodiments of the present invention may lower the temperature of the coolant before the supply of power to the inverter and, even when the inverter causes heat generation with the supply of power to the inverter, cool the inverter by the coolant of low temperature.

DETAILED DESCRIPTION

Embodiments of the present invention will be described below with reference to the drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Figure 1:
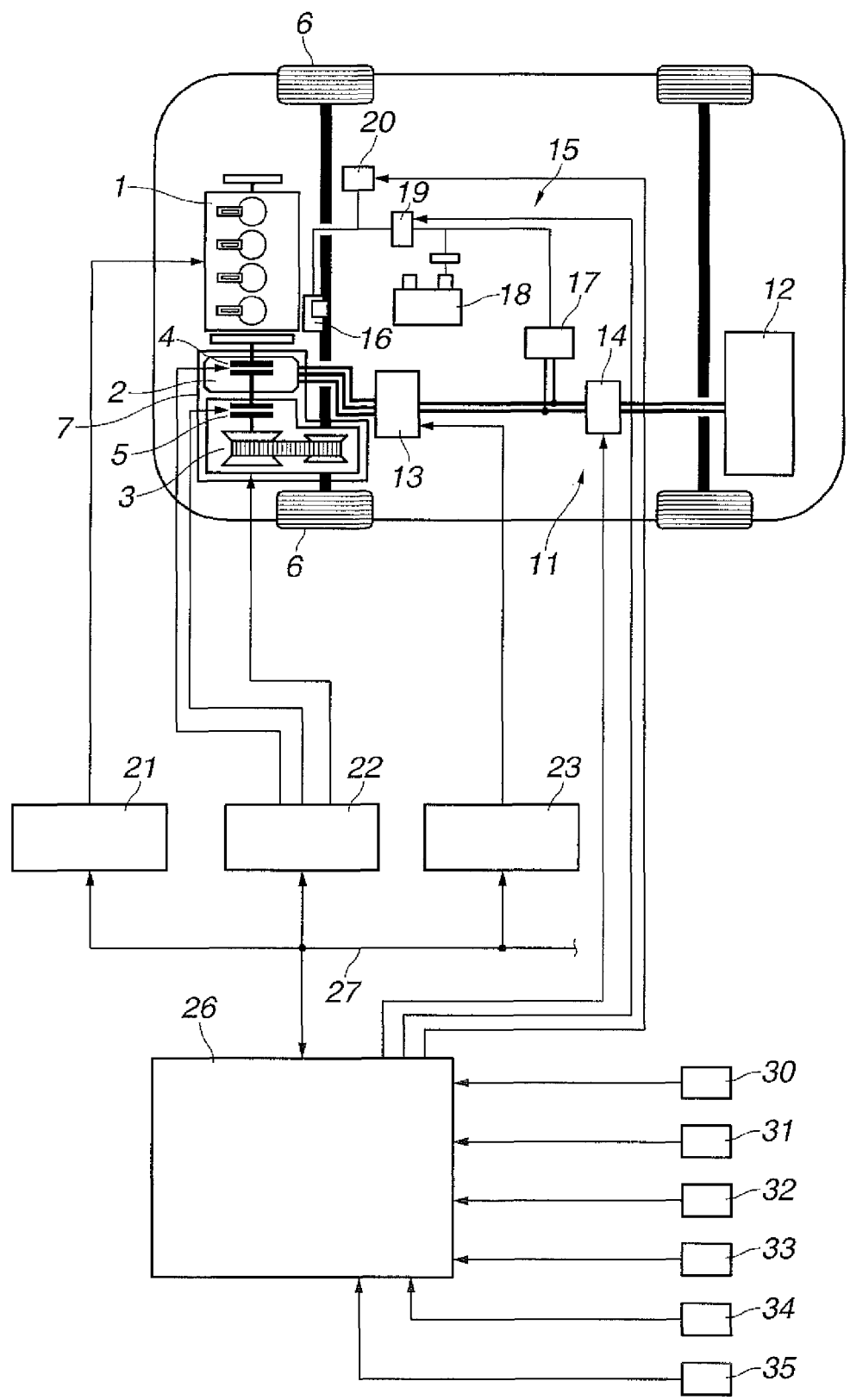
FIG. 1 is a system configuration diagram of a hybrid vehicle according to one or more embodiments of the present invention.

FIG. 1 is a system configuration diagram of a FF-type (front engine/front drive) hybrid vehicle according to one or more embodiments of the present invention.

The hybrid vehicle has a vehicle driving source including an engine 1 as an internal combustion engine and a motor generator 2 as a motor and a belt-type continuously variable transmission 3 as a transmission mechanism. A first clutch 4 is disposed between the engine 1 and the motor generator 2. A second clutch 5 is disposed between the motor generator 2 and the belt-type continuously variable transmission 3.

The engine 1 is in the form of e.g. a gasoline engine. Start/stop control, throttle opening control and fuel cut control of the engine 1 are performed based on control commands from an engine controller 21.

The first clutch 4 is arranged between an output shaft of the engine 1 and a rotor of the motor generator 2 so as to connect or disconnect the engine 1 to or from the motor generator 2 according to a selected vehicle running mode. Engagement/release of the first clutch 4 is controlled with the application of a first clutch hydraulic pressure by a hydraulic unit based on a control command from a CVT controller 22. In one or more embodiments of the present invention, the first clutch 4 is of the normally open type.

The motor generator 2 is in the form of e.g. a three-phase synchronous motor generator. The motor generator 2 is coupled to a high power circuit 11, which includes a high-voltage battery 12, an inverter 13 and a high power relay 14, and is driven based on a control command from a motor controller 23 so as to perform not only a motor function (called "power running function") for generating a positive torque by the supply of power from the high-voltage battery 12 through the inverter 13 but also a regenerative function for generating electric power by absorption of a torque and charging the high-voltage battery 12 through the inverter 13.

The second clutch 5 is arranged between the rotor of the motor generator 2 and an input shaft of the belt-type continuously variable transmission 3 so as to transfer or disconnect driving power from the vehicle driving source such as engine 1 and motor generator 2 to driving wheels 6 (front wheels). Engagement/release of the second clutch 5 is controlled with the application of a second clutch hydraulic pressure by the hydraulic unit based on a control command from the CVT controller 22. In particular, the second clutch 5 can be brought into a slip engagement state so as to allow power transmission with clutch slippage by variably controlling the transmission torque capacity of the second clutch 5. This enables smooth starting of the vehicle and achieves creep running of the vehicle even without a torque converter.

It is herein feasible to utilize a forward clutch or reverse brake of a forward/reverse switching device mounted on an input part of the belt-type continuously variable transmission 3, rather than to utilize a single friction element, as the second clutch 5. The forward/reverse switching device is provided to switch the direction of input of the torque to the belt-type continuously variable transmission 3 between a forward direction for forward running and a reverse direction for reverse running and, although not specifically shown in the drawing, includes a planetary gear train, a forward clutch engaged during the forward running and a reverse brake engaged during the reverse running. The forward clutch serves as the second clutch 5 during the forward running, whereas the reverse brake serves as the second clutch 5 during the reverse running. When both of the forward clutch and the reverse clutch as the second clutch 5 are released, the rotor of the motor generator 2 and the belt-type continuously variable transmission 3 are substantially disconnected from each other with no torque transmission. Each of the forward clutch and the reverse clutch is of the normally open type in one or more embodiments of the present invention.

The belt-type continuously variable transmission 3 includes an input-side primary pulley, an output-side secondary pulley and a metal belt wound around the primary and secondary pulleys. The radii of contact of the primary and secondary pulleys with the belt are respectively changed with the application of primary and secondary hydraulic pressures by the hydraulic unit based on command signals from the CVT controller 22, thereby continuously varying a transmission gear ratio. An output shaft of the belt-type continuously variable transmission 3 is connected to the driving wheels 6 via a final reduction gear mechanism.

The belt-type continuously variable transmission 3 and the motor generator 2 are accommodated in the same housing 7 and mounted together as a single module on the vehicle.

Further, the engine 1 is equipped with a starter motor 16 for engine starting. The starter motor 16 is in the form of e.g. a direct-current motor whose rated voltage is lower than that of the motor generator 2. The starter motor 16 is coupled to a low power circuit 15, which includes a DC/DC converter 17, a low-voltage battery 18, a low power relay 19 and an electric water pump 20, and is driven based on a control command from the engine controller 21 for cranking of the engine 1.

The low-voltage battery 18 is charged with power from the high power circuit 11, which includes the high-voltage battery 12, through the DC/DC converter 17. The control system such as engine controller 21, the air conditioner 1, the audio system, the lightening system etc. of the vehicle are supplied with charged power from the low power circuit 18. ON/OFF control of the high power relay 14 and ON/OFF control of the low power relay 19 are performed by an integrated controller 26.

The control system of the hybrid vehicle includes, in addition to the engine controller 21, the CVT controller 22 and the motor controller 23, the integrated controller 26 for integrated control of the entire vehicle. These controllers 21, 22, 23, and 26 are in communication with one another via a CAN communication line 27 for information exchange. There are provided various sensors such as an accelerator opening sensor 31, an engine speed sensor 32 that detects a rotation speed of the engine 1, a vehicle speed sensor 33, a motor speed sensor 34 that detects a rotation speed of the motor generator 2 and an oil temperature sensor 35 that detects the temperature of hydraulic oil used for hydraulic pressure generation in the belt-type continuously variable transmission 3. Detection signals of these sensors are inputted into the respective controllers such as integrated controller 26 individually or through the CAN communication line 27.

The above-configured hybrid vehicle has, as its running mode, an electric running mode (hereinafter referred to as "EV mode"), a hybrid running mode (hereinafter referred to as "HEV mode"), a driving torque control starting mode (hereinafter referred to as "WSC mode") etc. Any suitable one of these modes is selected as the running mode according to the vehicle operation state, driver's accelerator operation and the like.

In the EV mode, only the motor generator 2 is used as the vehicle driving source by release of the first clutch 4. The EV mode includes a motor running mode and a regenerative running mode. The EV mode is selected in the range where the driver's required driving force is relatively small.

In the HEV mode, both of the engine 1 and the motor generator 2 are used as the vehicle driving source by engagement of the first clutch 4. In one or more embodiments of the present invention, the HEV mode includes a motor assist running mode, a running power generation mode and an engine running mode. The EV mode is selected in the range where the driver's required driving force is relatively large or in the case where there is a demand from the system according to the state of charge (SOC) of the high-voltage battery 12, the operation state of the vehicle and the like.

The WSC mode is selected in the range where the vehicle running speed is relatively low, e.g., at a start of the vehicle. In the WSC mode, the engine 1 and the motor generator 2 are used as the vehicle driving source by engagement of the first clutch 4. Further, the second clutch 5 is brought into a slip engagement state by varying the torque transmission capacity of the second clutch 5 while controlling the rotation speed of the motor generator 2. This WSC mode allows use of the engine 1 as the vehicle driving source even in the very low vehicle speed range where a target input rotation speed of the belt-type continuously variable transmission 3 is lower than an engine idling speed.

Figure 2:
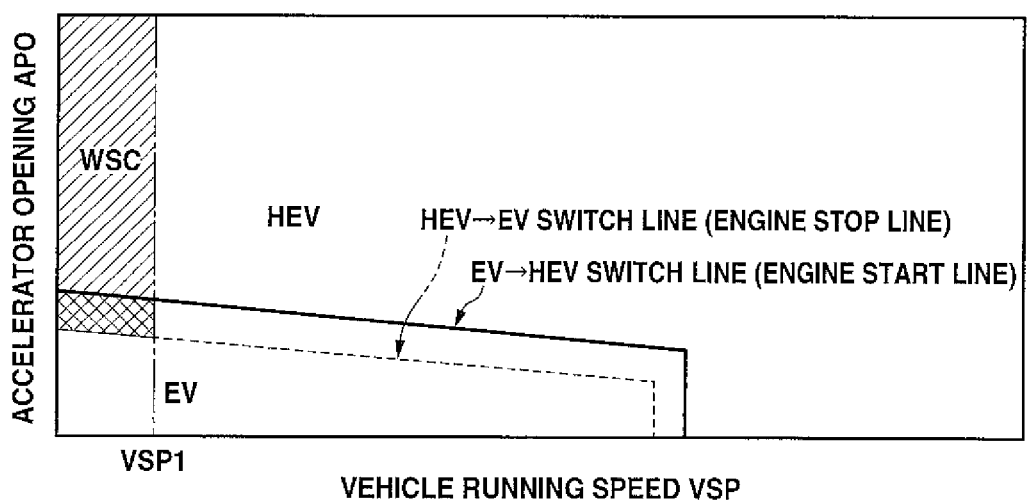
FIG. 2 is a diagram showing mode switching characteristics of the hybrid vehicle.

FIG. 2 is a diagram showing the basic characteristics of switching among the EV mode, the HEV mode and the WSC mode on the basis of the vehicle running speed VSP and the accelerator opening APO. As shown in the diagram, the mode switching characteristics are set with appropriate hysteresis between an HEY-to-EV mode switch line for switching from the HEV mode to the EV mode and an EV-to-HEY mode switch line for switching from the EV mode to the HEV mode. Further, the mode switching characteristics are set so as to allow selection of the WSC mode in the range where the vehicle running speed is lower than or equal to a predetermined vehicle running speed value PSP1.

Figure 3:
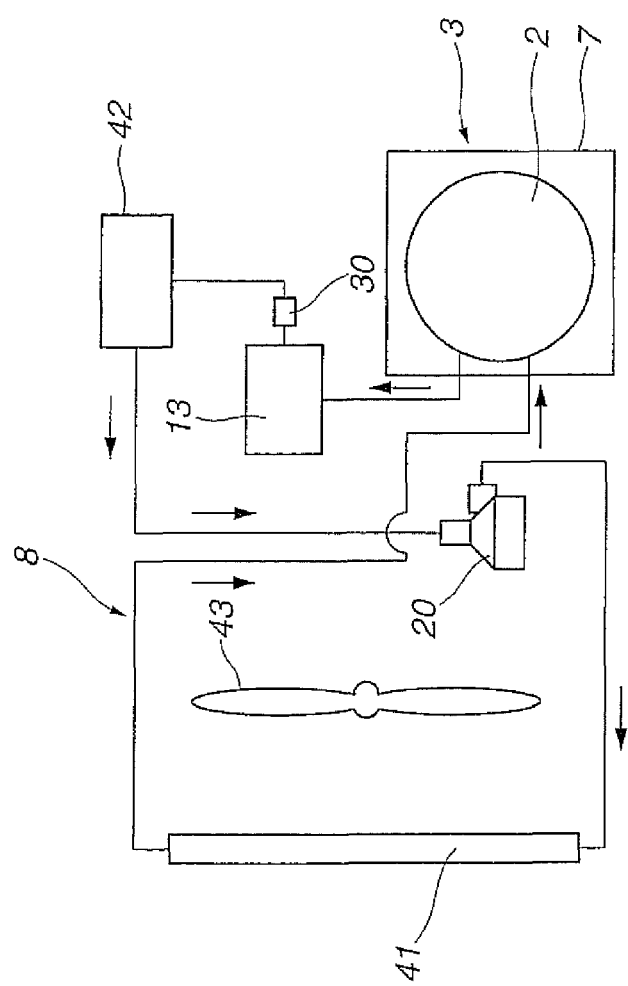
FIG. 3 is a schematic view of a cooling system of the hybrid vehicle.

As shown in FIG. 3, the hybrid vehicle has a cooling circuit 8 provided as a cooling mechanism to circulate coolant water therethrough by driving of the water pump 20 such that the motor generator 2 and the inverter 13 are cooled by the coolant water. In the cooling circuit 8, the coolant water flows in the direction of arrows in FIG. 3. The cooling circuit 8 includes a radiator 41 that cools the coolant water by heat radiation and a reservoir tank 42. A coolant water temperature sensor 30 is provided on a coolant water outlet side of the inverter 13 so as to detect a temperature of the coolant water. In place of the coolant water temperature sensor 30, it is feasible to provide a coolant water temperature estimation device capable of estimating the coolant water temperature. In FIG. 3, reference numeral 43 designates an electric fan that sends a cooling wind to the radiator 41.

When a start-up request for the vehicle system is made at power-on of the hybrid vehicle by driver's key operation such as push of a push button, a predetermined start-up sequence is executed to select a start-up mode according to the current state of the hybrid vehicle and set the vehicle to a ready-to-run status (READY-ON) in the selected start-up mode.

In the case where the available output torque of the motor generator 2 is small at the input of the system start-up request, for example, a first start-up mode is selected so as to start the engine 1 by the starter motor 16 and allow running of the vehicle by output torque of the engine 1. In the first start-up mode, starter control is performed to start the engine 1 by the starter motor 16; the high power relay 14 is connected (ON) to establish electrical connection between the high-voltage battery 12 and the motor generator 2; and the first clutch 4 is engaged with the application of hydraulic pressure by starting the motor generator 2 as pre-start setup. By this, the hybrid vehicle is set to the ready-to-run status (READY-ON).

In the case where the sufficient output torque for starting of the vehicle is available from the motor generator 2 at the input of the system start-up request, a second start-up mode is selected so as to allow running of the vehicle by output torque of the motor generator 2 without starting the engine 1. In the second starting mode, the high power relay 14 is connected (ON) to establish electrical connection between the high-voltage battery 12 and the motor generator 2; and the hydraulic pressure is applied to the second clutch 5 by starting the motor generator 2 as pre-starting setup. By this, the hybrid vehicle is set to the ready-to-run status (READY-ON).

Herein, the belt-type continuously variable transmission 3 and the motor generator 2 are accommodated in the same housing 7 and situated close to each other. The coolant water flowing through the cooling circuit 8 is accordingly influenced by heat from the belt-type continuously variable transmission 3.

When the vehicle is powered on by driver's key operation in a condition that the temperature of the belt-type continuously variable transmission 3 is high (i.e. the temperature of the hydraulic oil in the belt-type continuously variable transmission 3 is high), for example, the circulation of the coolant water in the cooling circuit 8 is stopped so that the temperature of the coolant water in the vicinity of the motor generator 2 is raised due to conduction of heat from the belt-type continuously variable transmission 3.

There is thus a possibility that, in the case where the inverter 13 is located on a downstream side of the motor generator 2 in the cooling circuit 8, the coolant water of high temperature may temporarily flow into the inverter 13 upon start-up of the water pump 20.

In other words, there is a possibility that, in the case where the temperature of the coolant water on the outlet side of the inverter 13 is high at power-on of the vehicle by driver's key operation, the coolant water of such temperature that cooling of the inverter 13 is not expected may temporarily flow into the inverter 13 from the motor generator 2 immediately after start-up of the water pump 20. When the inverter 13 becomes actuated at such a timing and causes heat generation from electronic components such as IGBT (insulated gate bipolar transistor), the temperature of the inverter 13 may become higher than or equal to an allowable temperature level (e.g. junction temperature) without the inverter 13 being cooled by the coolant water.

In view of the above circumstance, the vehicle control system is configured to, in a high-coolant-temperature start-up condition that the coolant water temperature detected by the coolant water temperature sensor 30 at power-on of the vehicle by driver's key operation is higher than or equal to a predetermined temperature value, to start driving of the water pump 20 before the supply of power from the high-voltage battery 12 to the inverter 13 and to the DC/DC converter 17 by connection (ON) of the high power relay 14. Namely, the water pump 20 is started at the timing when the ignition switch is turned on (IGN-ON) after the power-on of the vehicle by driver's key operation. The motor generator 2 is then actuated to start circulation of the coolant water in the cooling circuit 8 before the start of heat generation in the inverter 13. At this time, the water pump 20 is driven at a fixed duty ratio for a predetermined time period T. The predetermined time period T is set, for example, such that the coolant water in the radiator 41 of the cooling circuit 8 reaches at least the inverter 13 before start-up of the water pump 20. The IGN-ON timing is set as e.g. the timing of selection (determination) of the start-up mode in response to the system start-up request.

It is possible by such drive control to lower the temperature of the coolant water before the supply of power to the inverter 13 and, even when the inverter 13 causes heat generation with the supply of power, cool the inverter 13 by the coolant water of low temperature such that the temperature of the inverter 13 does not become higher than or equal to the allowable temperature level (e.g. junction temperature).

In the case where the water pump 20 is driven in the high-coolant-temperature start-up condition, the control of the water pump 20 is switched to normal drive control after the lapse of the predetermined time period T. By the normal drive control, the water pump 20 is driven at a duty ratio according to the temperature of the coolant, rather than at a fixed duty ratio. In the case where the vehicle is not in the ready-to-run status (READY-ON) even after the lapse of the predetermined time period T, the water pump 20 is stopped until the vehicle is set to the ready-to-run status (READY-ON). Then, the water pump 20 is driven by the normal drive control as mentioned above after the vehicle is set to the ready-to-run status (READY-ON). Further, the water pump 20 is stopped in the case where a power-off request for the vehicle has been made by driver's key operation before the lapse of the predetermined time period T. The water pump 20 is also stopped in the case where the voltage of the low-voltage battery 18 becomes lower than or equal to a predetermined voltage level, with the high power relay 14 being disconnected (OFF), before the lapse of the predetermined time period T.

Figure 4:
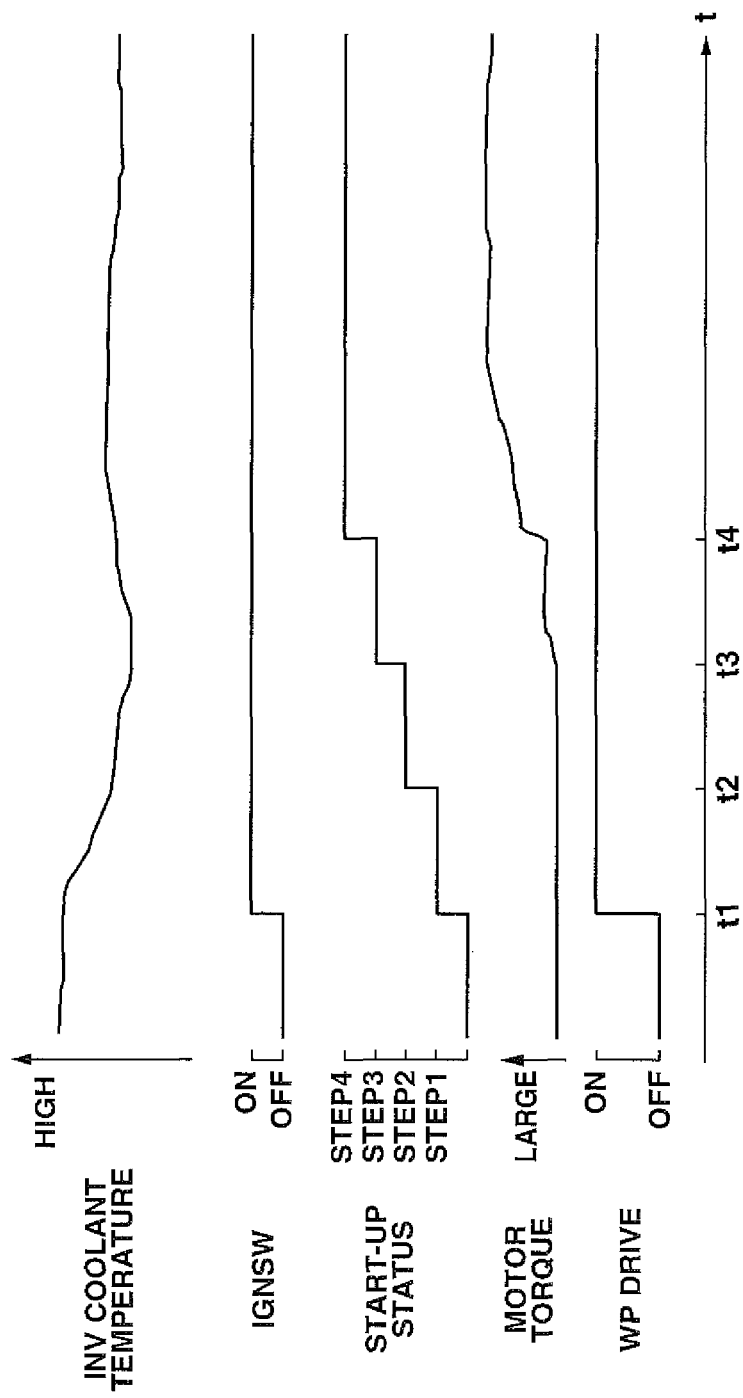
FIG. 4 is a time chart showing an operation example of the vehicle in the case where the vehicle is powered on by driver's key operation.
Figure 5:
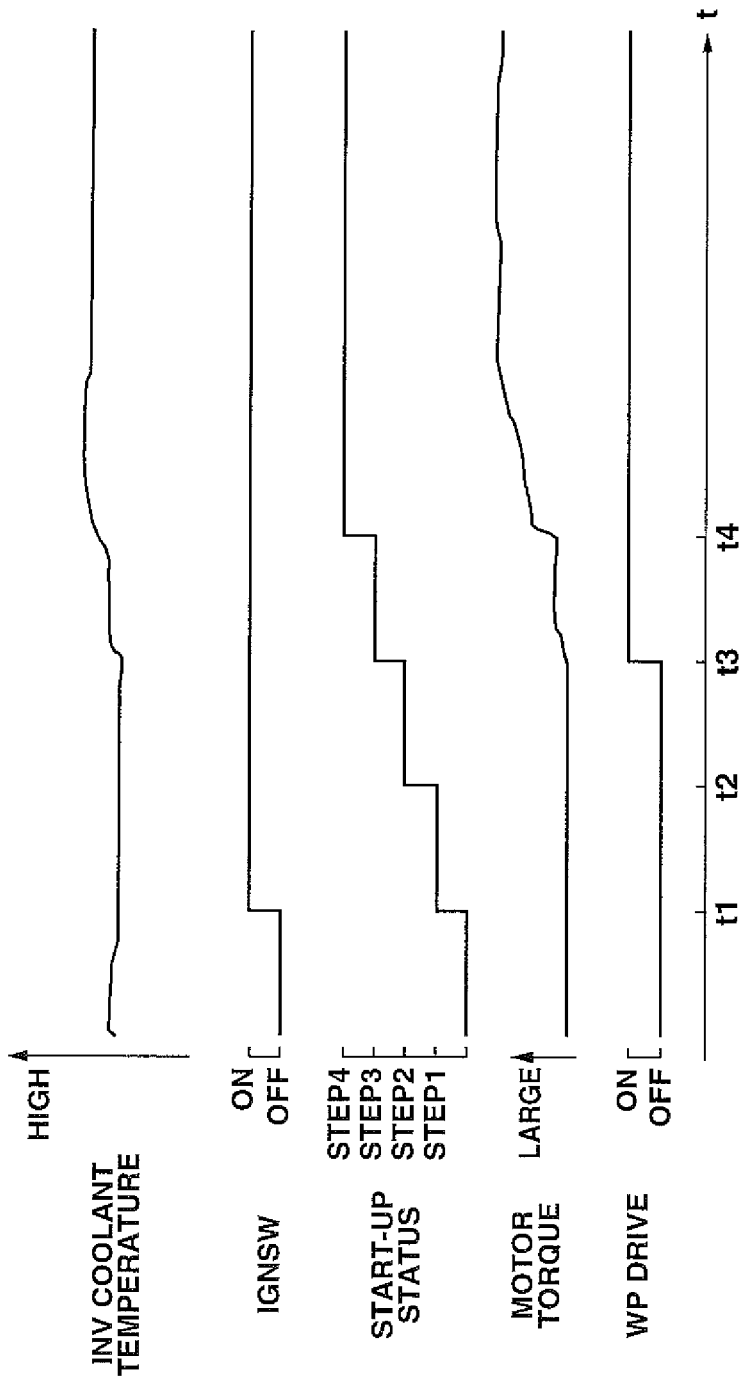
FIG. 5 is a time chart showing another operation example of the vehicle in the case where the vehicle is powered on by driver's key operation.

FIGS. 4 and 5 are time charts showing operation examples of the vehicle in the case where the vehicle is powered on by driver's key operation. In FIGS. 4 and 5, the start-up status refers to the respective step of the start-up sequence. More specifically, STEP 1 corresponds to the status in which the ignition switch is turned on (IGN-ON); STEP 2 corresponds to the status in which the high power relay 14 is connected (ON); STEP 3 corresponds to the status in which the motor generator 2 is driven; and STEP 4 corresponds to the status in which e.g. the second clutch 2 is engaged. Furthermore, time t1 refers to the IGN-ON timing of the ignition switch; time t2 refers to the connection (ON) timing of the high power relay 14; time t3 refers to the start timing of the motor generator 2; and time t4 refers to e.g. the engagement timing of the second clutch 5.

In the case where the temperature of the coolant water in the cooling circuit 8 on the outlet side of the inverter 13 (hereinafter also referred to as "INV coolant temperature") is higher than or equal to the predetermined temperature value at the power-on of the vehicle, the coolant water of such temperature that cooling of the inverter 13 is not expected may temporarily flows into the inverter 13 immediately after the start-up of the water pump 20. The water pump 20 is thus started by the power of the low-voltage battery 18 at time t1 when the ignition switch is turned to the IGN-ON status upon the power-on of the vehicle by driver's key operation as shown in FIG. 4.

In the case where the temperature of the coolant in the cooling circuit 8 at the outlet side of the inverter 13 (INV coolant temperature) is lower than the predetermined temperature value at the power-on of the vehicle, on the other hand, the coolant water of such temperature that cooling of the inverter 13 is not expected would not flow into the inverter 13 immediately after start-up of the water pump 20. The water pump 20 is thus started at time t3 when the motor generator 2 is started after the connection (ON) timing of the high power relay 14 (time t2), rather than at the IGN-ON timing of the ignition switch (time t1), as shown in FIG. 5.

In the case where the voltage of the low-voltage battery 18 is lower than or equal to the predetermined voltage level, priority is given to protection of the low-voltage battery 18. In this case, the water pump 20 is prevented from start-up until the connection (ON) of the high power relay 14 even in the high-coolant-temperature start-up condition. In the case where the starter motor 16 is driven by the power of the low-voltage battery 18 such that the vehicle is set ready for running by the output torque of the engine 1, the water pump 20 is also prevented from start-up until the connection (ON) of the high power relay 14 even in the high-coolant-temperature start-up condition.

In the case where there is a failure in the coolant water temperature sensor 30, the water pump 20 is prevented from start-up during a time period from the power-on of the vehicle by driver's key operation to the supply of power from the high-voltage battery 12 to the DC/DC converter 17 and is driven at a maximum dischargeable flow rate after the supply of power from the high-voltage battery 12 to the DC/DC converter 17.

Figure 6:
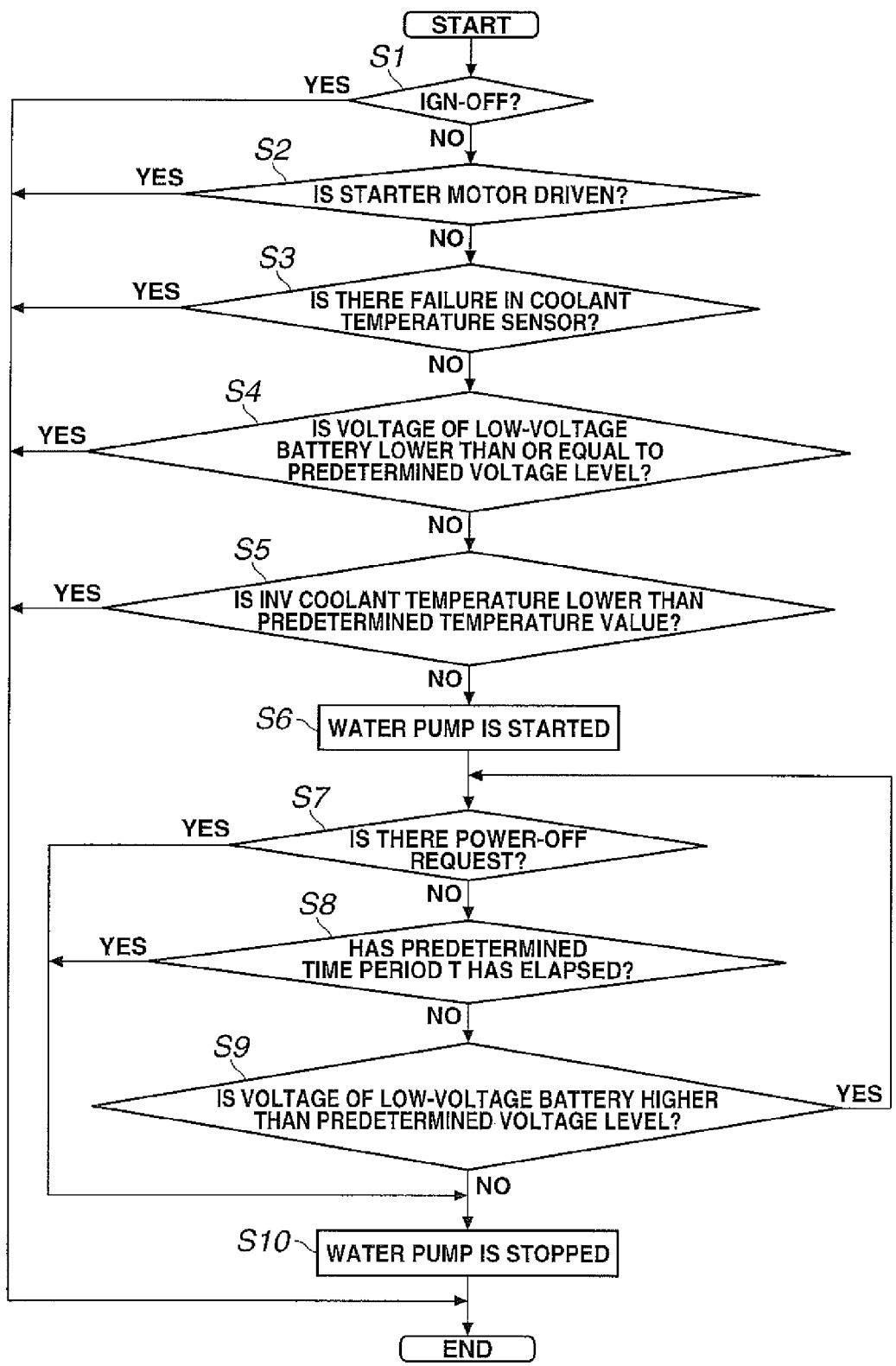
FIG. 6 is a flowchart for a water pump control process executed at power-on of the vehicle according to one or more embodiments of the present invention.

FIG. 6 is a flowchart for control of the water pump 20 at power-on of the vehicle.

It is first judged whether or not the ignition switch is turned to the IGN-ON status upon power-on of the vehicle by driver's key operation (step S1). Then, it is judged whether or not there are satisfied requirements that do not allow start-up of the water pump 20 even in the above-mentioned high-coolant-temperature start-up condition (steps S2 to S5). More specifically, it is judged in step S1 whether the starter motor 16 is driven. The control exits from the current routine when the starter motor 16 is judged to be driven. It is judged in step S3 whether there is any failure in the coolant water temperature sensor 30. The control exits from the current routine when the failure is occurring in the coolant water temperature sensor 30. It is judged in step S4 whether the voltage of the low-voltage battery 18 is lower than or equal to the predetermined voltage level. The control exits from the current routine when the voltage of the low-voltage battery 18 is lower than or equal to the predetermined voltage value. It is judged in step S5 whether the detection value of the coolant water temperature sensor 30 is higher than or equal to the predetermined temperature value. When the detection value of the coolant water temperature sensor 30 is higher than or equal to the predetermined temperature value, the control proceeds to step S6. The control exits from the current routine when the detection value of the coolant water temperature sensor 30 is lower than the predetermined temperature value.

In step S6, the water pump 20 is started. In step S7, it is judged whether or not there has been a power-off request for the vehicle by driver's key operation after the start-up of the water pump 20. When the power-off request has been made after the start-up of the water pump, the control proceeds to step S10. The control proceeds to step S8 when the power-off request has not been made after the start-up of the water pump.

In step S8, it is judged whether the predetermined time period T has elapsed after the start-up of the water pump 20. The control proceeds to step S10 when the predetermined time period T has elapsed after the start-up of the water pump. When the predetermined time period T has not elapsed after the start-up of the water pump, the control proceeds to step S9. In step S9, it is judged whether the voltage of the low-voltage battery 18 is lower than or equal to the predetermined voltage value. When the voltage of the low-voltage battery 18 is lower than or equal to the predetermined voltage value, the control proceeds step S10. The control proceeds to step S7 when the voltage of the low-voltage battery 18 is not lower than or equal to the predetermined voltage value. In step S10, the water pump 10 is stopped.

In the case there the temperature of the belt-type continuously variable transmission 3 is high at the input of the power-off request for the vehicle by driver's key operation, it is feasible to cool the coolant water in the cooling circuit 8 by driving the water pump 20 for a predetermined time after the power-off request. The vehicle control system may be thus configured to, in the case where the temperature of the hydraulic oil in the belt-type continuously variable transmission 3 is high at the input of the power-off request for the vehicle by driver's key operation, continue driving of the water pump for the predetermined time even after the power-off request.

More specifically, in a high-oil-temperature stop condition that the temperature of the hydraulic oil detected by the oil temperature sensor 35 at the input of the power-off request for the vehicle by driver's key operation is higher than or equal to a predetermined temperature value, pump stop delay control is executed to continue driving of the water pump 20 for a predetermined time period T2 (e.g. about 30 seconds) after the request for power-off of the vehicle. When the ignition switch is turned off (IGN-OFF) after the request for power-off of the vehicle by driver's key operation, the vehicle is powered off. However, not only the water pump 20 but also the integrated controller 26 for the pump stop delay control of the water pump 20 are supplied with power. After the completion of the pump stop delay control, the integrated controller 26 stops the water pump 20 and perform self-shutoff function to interrupt the power supply to itself. Namely, the self-shutoff function of the integrated controller 26 is delayed during execution of the pump stop delay control.

The driving of the water pump 20 is stopped in the case where the voltage of the low-voltage battery 18 becomes lower than or equal to a predetermined voltage level during the execution of the pump stop delay control. In the case where the vehicle is powered on by driver's key operation during the execution of the pump stop delay control, the pump stop delay control is continued. After the lapse of the predetermined time period T2, the control of the water pump 20 is switched to normal drive control so that the water pump 20 is driven by the normal drive control. When the pump stop delay control is started, the pump stop delay control is continued until the lapse of the predetermined time period T2 regardless of whether the hydraulic oil temperature detection value of the oil temperature sensor 35 becomes lower than the predetermined temperature value.

It is consequently possible to, in a condition that the temperature of the hydraulic oil in the belt-type continuously variable transmission 3 is high, facilitate supplying the coolant water of low temperature at the next power-on of the vehicle by driving the water pump 20 for the predetermined time period T2 after the request for power-off of the vehicle by driver's key operation as mentioned above.

The pump stop delay control is not executed in the case where there is a failure in the oil temperature sensor at the time for power-off of the vehicle by driver's key operation. Further, the pump stop delay control is not executed in the case where there is a communication abnormality in the CAN communication line 27 even in the high-oil-temperature stop condition. In the case where the vehicle is powered on by driver's key operation during the execution of the pump stop delay control, the water pump 20 is driven by the normal drive control as mentioned above after the execution of the pump stop delay control for the predetermined time period T2.

FIGS. 7 to 10 are time charts showing operation examples of the vehicle in the case where there the power-off request for the vehicle is made by driver's key operation.

Figure 7:
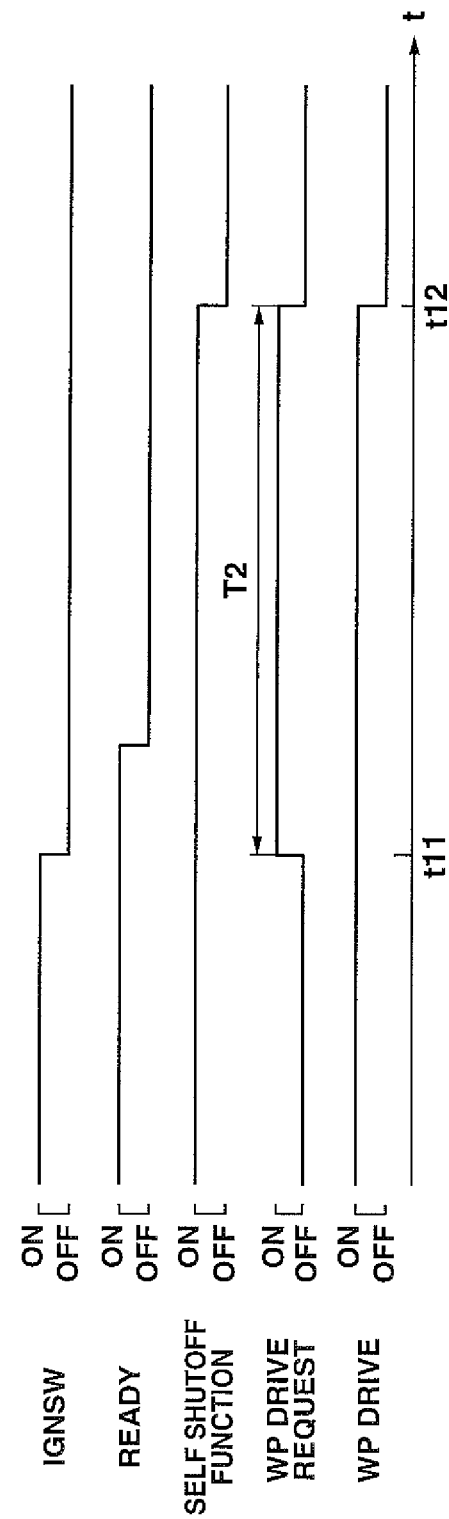
FIG. 7 is a time chart showing an operation example of the vehicle in the case where there is a power-off request for the vehicle by driver's key operation.

The timing chart of FIG. 7 refers to the case where the pump stop delay control is executed for the predetermined time period T2.

At time t11, the ignition switch is turned to the IGN-OFF status. At this point of time, the oil temperature detection value of the oil temperature sensor 35 is higher than or equal to the predetermined temperature value. The execution of the pump stop delay control is thus requested (WP drive request).

The pump stop delay control is executed during the predetermined time period T2 from time t11. When the pump stop delay control is completed at time t12, the integrated controller 26 for control of the water pump 20 performs self-shutoff function. Namely, the self-shutoff function of the integrated controller 26 is delayed during the execution of the pump stop delay control.

Herein, the hybrid vehicle is switched from the ready-to-run status (READY-ON) to a not-ready-to-run status (READY-OFF) by disconnection (OFF) of the high power relay 14 during the time period from time t11 to time t12.

Figure 8:
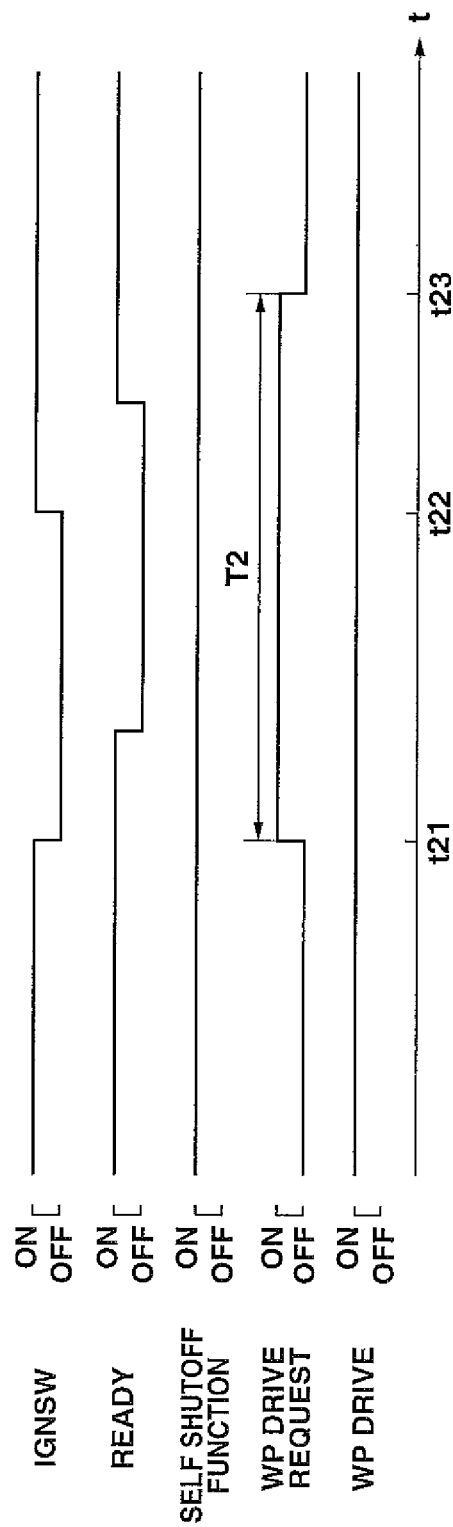
FIG. 8 is a time chart showing another operation example of the vehicle in the case where there is a power-off request for the vehicle by driver's key operation.

The timing chart of FIG. 8 refers to the case where the vehicle is powered on by driver's key operation during the execution of the pump stop delay control.

At time t21, the ignition switch is turned to the IGN-OFF status. At this point of time, the oil temperature detection value of the oil temperature sensor 35 is higher than or equal to the predetermined temperature value. The execution of the pump stop delay control is thus requested (WP drive request).

When the vehicle is powered on by driver's key operation during the execution of the pump stop delay control, the ignition switch is turned to the IGN-ON status at time t22.

Although the water pump 20 is kept driven from time t22 onward, there is no request for execution of the pump stop delay control (WP drive request) after the lapse of the predetermined time period T2. The control of the water pump 20 is switched to the normal drive control from time t23 onward. In this case, the self-shutoff function of the integrated controller 26 is also delayed during the execution of the pump stop delay control.

Herein, the hybrid vehicle is switched from the ready-to-run status (READY-ON) to the not-ready-to-run status (READY-OFF) by disconnection (OFF) of the high power relay 14 during a time period from time t21 to time t22. However, the hybrid vehicle is switched to the ready-to-run status (READY-ON) by time t23 as the high power relay 14 is connected (ON) again during a time period from time t22 to time t23.

Figure 9:
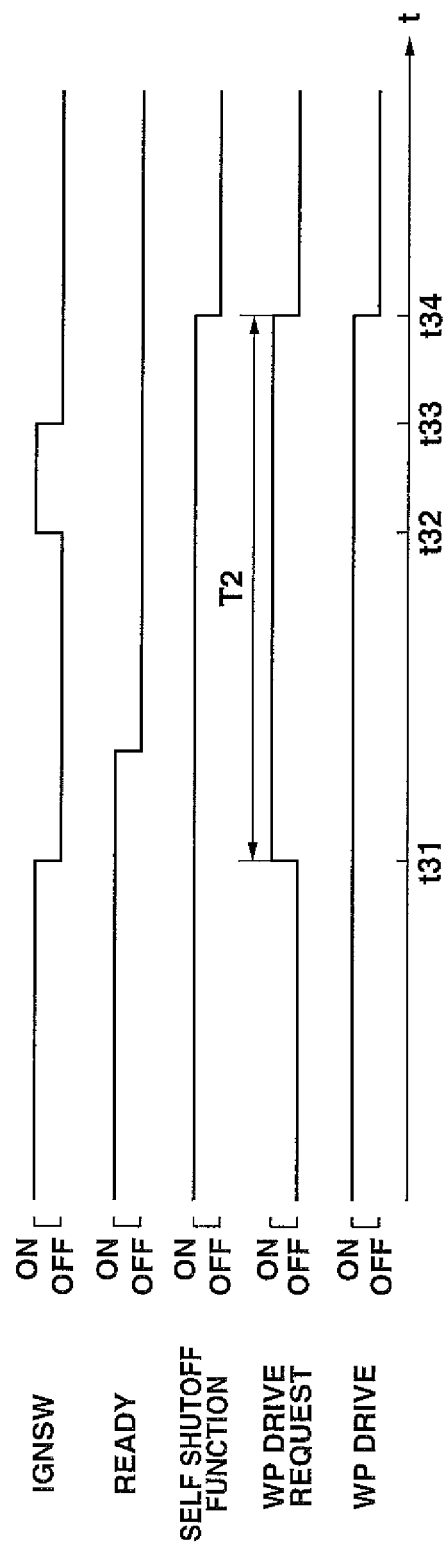
FIG. 9 is a time chart showing another operation example of the vehicle in the case where there is a power-off request for the vehicle by driver's key operation.

The timing chart of FIG. 9 refers to the case where, after the vehicle is powered on by driver's key operation during the execution of the pump stop delay control, another power-off request for the vehicle is made by driver's key operation.

At time t31, the ignition switch is turned to the IGN-OFF status. At this point of time, the oil temperature detection value of the oil temperature sensor 35 is higher than or equal to the predetermined temperature value. The execution of the pump stop delay control is thus requested (WP drive request).

When the vehicle is powered on by driver's key operation during the execution of the pump stop delay control, the ignition switch is turned to the IGN-ON status at time t32. When the power-off request for the vehicle is made by driver's key operation, the ignition switch is turned to the IGN-OFF status at time t33.

At time t33, the time of execution of the pump stop delay control has not reached the predetermined time period T2. The pump stop delay control is continued until the lapse of the predetermined time period T2 from time t31 to time t34.

When the pump stop delay control is completed at time t33, the integrated controller 26 for control of the water pump 20 performs self-shutoff function. Namely, the self-shutoff function of the integrated controller 26 is delayed during the execution of the pump stop delay control.

Herein, the hybrid vehicle is switched from the ready-to-run status (READY-ON) to the not-ready-to-run status (READY-OFF) by disconnection (OFF) of the high power relay 14 during a time period from time t31 to time t32.

Figure 10:
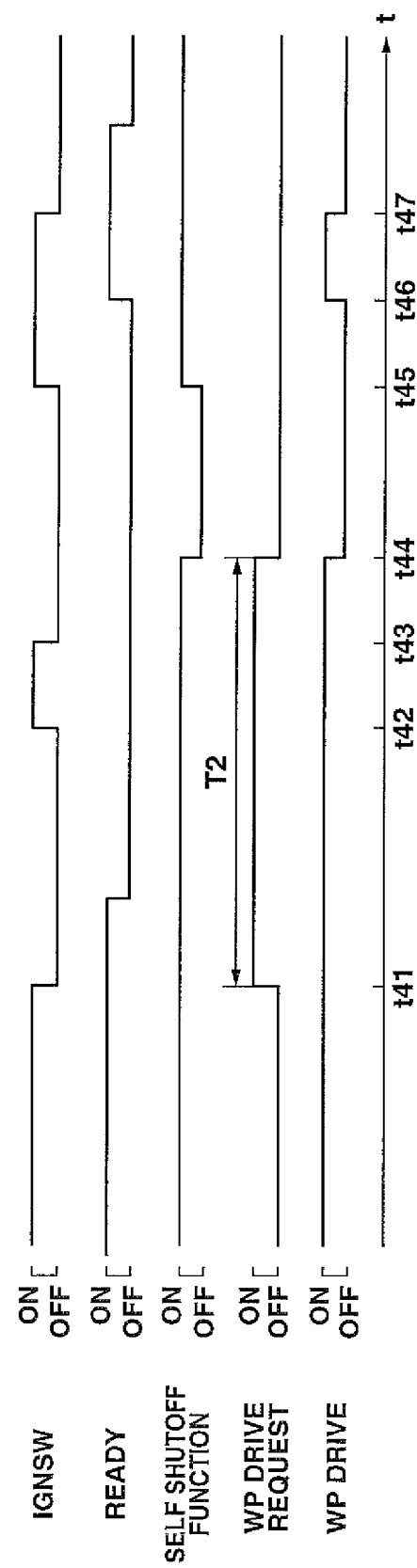
FIG. 10 is a time chart showing another operation example of the vehicle in the case where there is a power-off request for the vehicle by driver's key operation.
Figure 11:
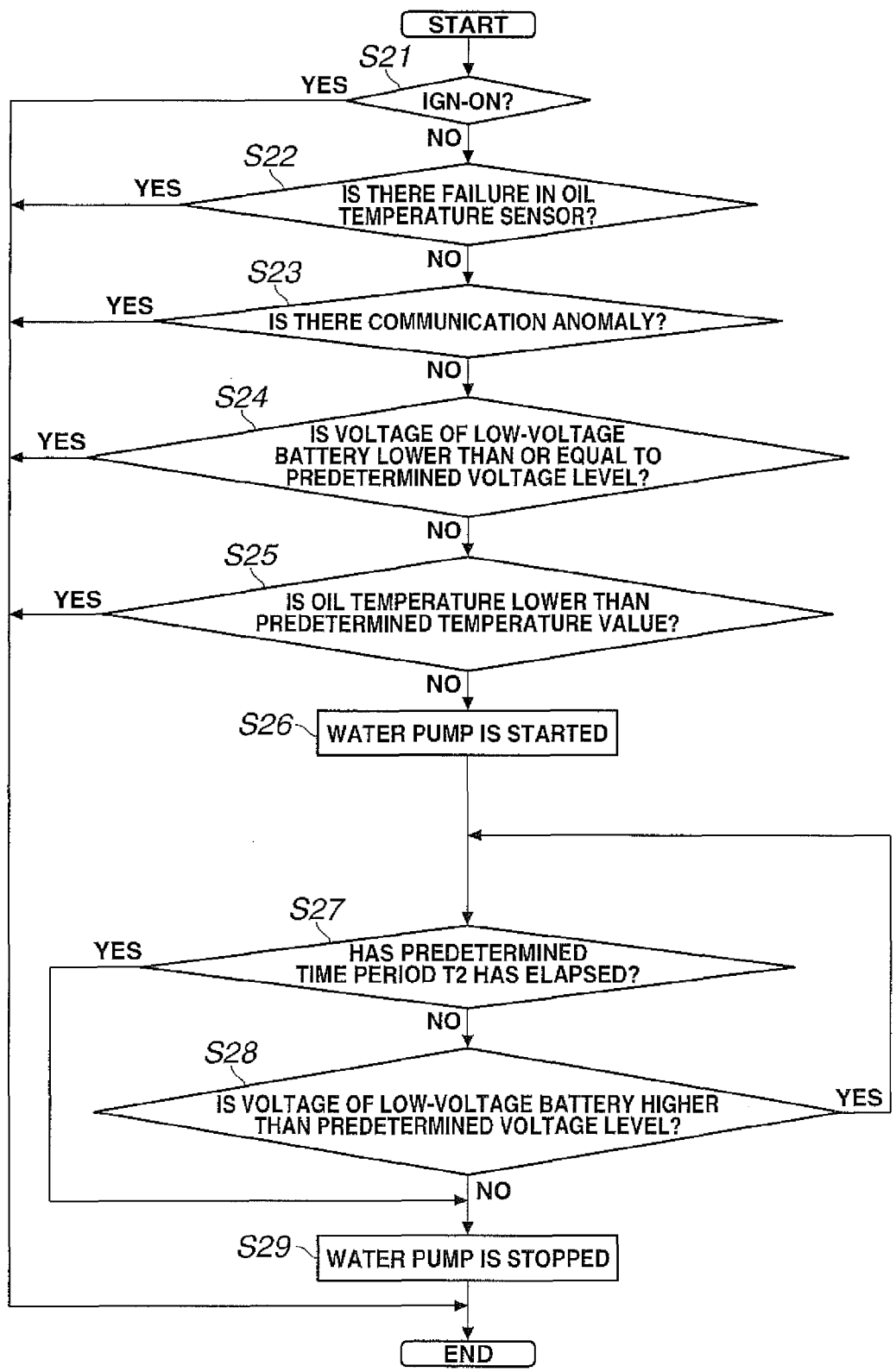
FIG. 11 is a flowchart for a water pump control process executed at power-off of the vehicle according to one or more embodiments of the present invention.

The timing chart of FIG. 10 refers to the case where, after the vehicle is powered on by driver's key operation during the execution of the pump stop delay control, another power-off request for the vehicle is made by driver's key operation, and then, the vehicle is again powered on by driver's key operation.

At time t41, the ignition switch is turned to the IGN-OFF status. At this point of time, the oil temperature detection value of the oil temperature sensor 35 is higher than or equal to the predetermined temperature value. The execution of the pump stop delay control is thus requested (WP drive request).

When the vehicle is powered on by driver's key operation during the execution of the pump stop delay control, the ignition switch is turned to the IGN-ON status at time t42. At time t43, the ignition switch is turned to the IGN-OFF status according to the power-off request for the vehicle by driver's key operation.

At time t43, the time of execution of the pump stop delay control has not reached the predetermined time period T2. The pump stop delay control is continued until the lapse of the predetermined time period T2 from time t41 to time t44.

When the pump stop delay control is completed at time t44, the integrated controller 26 for control of the water pump 20 performs self-shutoff function. Namely, the self-shutoff function of the integrated controller 26 is delayed during the execution of the pump stop delay control.

After that, the ignition switch is turned to the IGN-ON status at time t45 then the vehicle is again powered on by driver's key operation. The water pump 20 is driven from time t46. When the ignition switch is turned to the IGN-OFF status at time t47 according to the another power-off request for the vehicle by driver's key operation, the water pump 20 is stopped for protection of the low-voltage battery 18 due to the fact that, at time t47, the predetermined time period has not yet elapsed since the vehicle was set to the ready-to-run status (READY-ON) at time t46.

FIG. 10 is a flowchart for control of the water pump 20 at power-off of the vehicle.

In step S21, it is judged whether or not the ignition switch is turned to the IGN-OFF status in response to the power-off request for the vehicle by driver's key operation. When the ignition switch is turned to the IGN-OFF status, the control proceeds to step S22. When the ignition switch is not turned to the IGN-OFF status, the control exits from the current routine. In step S22, it is judged whether there is a failure in the oil temperature sensor 35. The control exits from the current routine when the failure is occurring in the oil temperature sensor 35. When there is no failure in the oil temperature sensor 35, the control proceeds to step S23. In step S23, it is judged whether there is a communication abnormality in the CAN communication line 27. The control exits from the current routine when the communication abnormality is occurring in the CAN communication line 27. When there is no communication abnormality in the CAN communication line 27, the control proceeds to step S24. In step S24, it is judged whether the voltage of the low-voltage battery 18 is lower than or equal to the predetermined voltage level. The control exits from the current routine when the voltage of the low-voltage battery 18 is lower than or equal to the predetermined voltage level. When the voltage of the low-voltage battery 18 is higher than the predetermined voltage level, the control proceeds to step S25. In step S25, it is judged whether the detection value of the oil temperature sensor 35 is higher than or equal to the predetermined temperature value. When the detection value of the oil temperature sensor 35 is higher than or equal to the predetermined temperature value, the control proceeds to step S26. The control exits from the current routine when the detection value of the oil temperature sensor 35 is lower than the predetermined temperature value.

In step S26, the driving of the water pump 20 is continued. In step S27, it is judged whether the predetermined time period T2 has elapsed after the input of the power-off request. The control proceeds to step S29 when the predetermined time T2 has elapsed after the input of the power-off request. When the predetermined time T2 has not elapsed after the start of the water pump, the control proceeds to step S28. In step S28, it is judged whether the voltage of the low-voltage battery 18 is lower than or equal to the predetermined voltage level. The control proceeds to step S29 when the voltage of the low-voltage battery 18 is lower than or equal to the predetermined voltage level. When the voltage of the low-voltage battery 18 is higher than the predetermined voltage level, the control proceeds to step S29. In step S27, the water pump 20 is stopped.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. A hybrid vehicle, comprising:
   an internal combustion engine and a motor as a driving source;
   a transmission that changes a speed of rotation of the internal combustion engine or motor and transmits the rotation to driving wheels of the vehicle;
   a high-voltage battery that supplies power to the motor through an inverter;
   a cooling mechanism equipped with a pump to circulate a coolant and thereby cool the inverter;
   a coolant temperature measurement device that detects or estimates a temperature of the coolant;
   a low-voltage battery that supplies power to the pump; and
   a converter through which power is supplied from the high-voltage battery to the pump,
   wherein, in a high-coolant-temperature start-up condition that the temperature of the coolant is higher than or equal to a predetermined temperature value at power-on of the vehicle by driver's key operation, the pump is started before the supply of the power from the high-voltage battery to the inverter and the convertor.

2. The hybrid vehicle according to claim 1, wherein, in the high-coolant-temperature start-up condition, the pump is driven for a predetermined time period before the supply of the power from the high-voltage battery to the inverter.

3. The hybrid vehicle according to claim 2, wherein the predetermined time is set such that the coolant in a radiator of the cooling mechanism reaches at least the inverter before the start of the pump.

4. The hybrid vehicle according to claim 1,
   wherein the motor is arranged in the same housing as the transmission;
   wherein the cooling mechanism has a radiator to cool the coolant;
   wherein the motor is located downstream of the radiator; and
   wherein the inverter is located downstream of the motor.

5. The hybrid vehicle according to claim 1,
   wherein, in the case where there is a failure in the coolant temperature measurement device, the pump is prevented from start-up until the supply of the power from the high-voltage battery to the converter.

6. The hybrid vehicle according to claim 1,
   wherein, in the case where a voltage of the low-voltage battery is lower than or equal to a predetermined voltage level, the pump is prevented from start-up until the supply of the power from the high-voltage battery to the converter even in the high-coolant-temperature start-up condition.

7. The hybrid vehicle according to claim 1, further comprising:

a starter motor supplied with power from the low-voltage battery to cause starting of the internal combustion engine, wherein, during driving of the starter motor, the pump is prevented from start-up until the supply of the power from the high-voltage battery to the converter even in the high-coolant-temperature start-up condition.

8. The hybrid vehicle according to claim 1, further comprising an oil temperature sensor that detects a temperature of a hydraulic oil in the transmission, wherein, in a high-oil-temperature stop condition that the temperature of the hydraulic oil is higher than or equal to a predetermined temperature value at input of a power-off request by driver's key operation, pump stop delay control is executed to continue driving of the pump for a second predetermined time period even after the input of the power-off request by driver's key operation.

9. The hybrid vehicle according to claim 8, wherein, in the case where there is a failure in the oil temperature sensor, the pump is stopped at the input of the power-off request by driver's key operation without execution of the pump stop delay control.

10. The hybrid vehicle according to claim 8, wherein, in the case where a voltage of the low-voltage battery is lower than or equal to a predetermined voltage level, the pump is stopped without execution of the pump stop delay control even in the high-oil-temperature stop condition.

11. The hybrid vehicle according to claim 8, wherein, in the case where the vehicle is powered on by driver's key operation during execution of the pump stop delay control, the pump stop delay control is continued.

* * * * *